US012096578B2

(12) United States Patent
Kim et al.

(10) Patent No.: US 12,096,578 B2
(45) Date of Patent: Sep. 17, 2024

(54) DISPLAY DEVICE HAVING A CURVED PORTION AND METHOD OF FABRICATING THE SAME

(71) Applicant: SAMSUNG DISPLAY CO., LTD., Yongin-si (KR)

(72) Inventors: Seul-Gi Kim, Seoul (KR); Jeongho Hwang, Seoul (KR); Yejin Kim, Seoul (KR); Cheolgeun An, Yongin-si (KR); Euiyun Jang, Seoul (KR); Wonjoon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 183 days.

(21) Appl. No.: 16/986,404

(22) Filed: Aug. 6, 2020

(65) Prior Publication Data
US 2021/0127517 A1    Apr. 29, 2021

(30) Foreign Application Priority Data
Oct. 23, 2019    (KR) .......................... 10-2019-0131829

(51) Int. Cl.
*H05K 5/03* (2006.01)
*B32B 3/02* (2006.01)
(Continued)

(52) U.S. Cl.
CPC ................. *H05K 5/03* (2013.01); *B32B 3/02* (2013.01); *B32B 7/12* (2013.01); *C09J 7/38* (2018.01);
(Continued)

(58) Field of Classification Search
CPC .... B32B 3/02; B32B 3/10; B32B 3/26; B32B 3/263; B32B 2307/51; B32B 2307/732;
(Continued)

(56) References Cited

U.S. PATENT DOCUMENTS 9,987,826 B2    6/2018    Cho et al.
10,638,619 B2    4/2020    Seo et al.
(Continued)

FOREIGN PATENT DOCUMENTS

CN    1537247 A    10/2004
CN    109148512 A    1/2019
(Continued)

*Primary Examiner* — Maria V Ewald
*Assistant Examiner* — Ethan Weydemeyer
(74) *Attorney, Agent, or Firm* — F. CHAU & ASSOCIATES, LLC

(57) ABSTRACT

A display device may include a window, a display panel, and an adhesive resin layer. The window may include a front surface portion and a curved portion, which is extended from the front surface portion and is bent with a curvature. The display panel may be combined with the window, and may include a first region corresponding to the front surface portion and a second region corresponding to the curved portion. The adhesive resin layer may be interposed between the window and the display panel to fasten the display panel to a rear surface of the window. The adhesive resin layer may include a first attachment portion corresponding to the front surface portion and a second attachment portion corresponding to the curved portion, and a thickness of the second attachment portion may be different from a first thickness of the first attachment portion.

18 Claims, 11 Drawing Sheets

(51) Int. Cl.
  *B32B 7/12* (2006.01)
  *C09J 7/38* (2018.01)
  *H04M 1/02* (2006.01)
  *H05K 5/00* (2006.01)
  *G06F 1/16* (2006.01)

(52) U.S. Cl.
  CPC ........ *H04M 1/0268* (2013.01); *H05K 5/0017* (2013.01); *B32B 2307/51* (2013.01); *B32B 2307/732* (2013.01); *B32B 2457/20* (2013.01); *G02F 2202/28* (2013.01); *G06F 1/1626* (2013.01); *H04M 1/0214* (2013.01)

(58) Field of Classification Search
  CPC ............. B32B 2457/20; H05K 5/0017; H04M 1/0268; G06F 1/626; G02F 2202/28
  See application file for complete search history.

(56) References Cited

U.S. PATENT DOCUMENTS

| | | | |
|---|---|---|---|
| 2004/0166288 A1* | 8/2004 | Travis | B32B 17/10036 |
| | | | 428/156 |
| 2016/0295715 A1* | 10/2016 | Cho | B32B 9/045 |
| 2018/0143499 A1 | 5/2018 | Lim et al. | |
| 2019/0061318 A1* | 2/2019 | Jung | G02F 1/133305 |

FOREIGN PATENT DOCUMENTS

| | | | |
|---|---|---|---|
| JP | 2015-099622 | 5/2015 | |
| KR | 10-2016-0119382 | 10/2016 | |
| KR | 20170093610 A * | 8/2017 | ............. B32B 3/263 |
| KR | 10-1822034 | 1/2018 | |

* cited by examiner

DISPLAY DEVICE HAVING A CURVED PORTION AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2019-0131829, filed on Oct. 23, 2019 in the Korean Intellectual Property Office, the disclosure of which is incorporated by reference herein in its entirety.

Technical Field

Exemplary embodiments of the inventive concept relate to a display device and a method of fabricating the same, and in particular, to a display device having a curved portion and a method of fabricating the same.

Discussion of Related Art

Various display devices are being developed for use in multimedia devices, such as televisions, mobile phones, tablet computers, navigation systems, and gaming machines. A keyboard, a mouse, or a remote controller may be used as an input device of the display device. The display device may further include a touch panel that is used as an input device.

Recently, display devices having a curved portion, such as a bendable display device, a curved-type display device, a foldable display device, and a rollable display device, are being developed.

SUMMARY

According to an exemplary embodiment of the inventive concept, a display device may include a window, a display panel, and an adhesive resin layer. The window may include a front surface portion and a curved portion, which is extended from the front surface portion and is bent with a curvature. The display panel may be combined with the window, and may include a first region corresponding to the front surface portion and a second region corresponding to the curved portion. The adhesive resin layer may be interposed between the window and the display panel to fasten the display panel to a rear surface of the window. The adhesive resin layer may include a first attachment portion corresponding to the front surface portion and a second attachment portion corresponding to the curved portion, and a thickness of the second attachment portion may be different from a first thickness of the first attachment portion.

The second attachment portion may have a second thickness, which is greater than the first thickness, in a first portion region of the curved portion of the window, and may have a third thickness, which is smaller than the first thickness, in a second portion region of the curved portion different from the first portion region.

The thickness of the second attachment portion in the first portion region may be increased from the first thickness to the second thickness with increasing distance from the first attachment portion, and the thickness of the second attachment portion in the second portion region may be decreased from the second thickness to the third thickness with increasing distance from a border between the first portion region and the second portion region.

The display panel may include a main display portion, which corresponds to the first region and is configured to display an image, and a sub-display portion, which corresponds to the second region and is configured to display an image.

The window may further include a double-curved portion, which is extended from the front surface portion and is bent from the front surface portion with at least two curvatures, and the adhesive resin layer may further include a third attachment portion corresponding to the double-curved portion.

The double-curved portion of the window may be provided between first and second curved portions, which are located adjacent to each other, and connects the first and second curved portions to each other. The double-curved portion may include a first sub-double-curved surface whose curvature is increased in a direction from a center axis, which is located at a center of the double-curved portion, toward the first curved portion, and a second sub-double-curved surface whose curvature is increased in a direction from the center axis toward the second curved portion.

The third attachment portion of the adhesive resin layer may have a curvature-dependent thickness and may have a thickness, which is greater than the first thickness of the first attachment portion, in a specific region.

According to an exemplary embodiment of the inventive concept, a display device may include a window, a display panel, and an adhesive resin layer. The display panel may be combined with the window, and may include a first region and a second region. The adhesive resin layer may be interposed between the window and the display panel to fasten the display panel to a rear surface of the window. The adhesive resin layer may include a first attachment portion disposed to correspond to the first region and a second attachment portion disposed to correspond to the second region. The first and second attachment portions of the adhesive resin layer may have different moduli from each other.

The first attachment portion of the adhesive resin layer may have a first modulus, and the second attachment portion may have a second modulus that is greater than the first modulus.

A thickness of the second attachment portion of the adhesive resin layer may be different from a first thickness of the first attachment portion.

The window may include a front surface portion and a curved portion, which is extended from the front surface portion and is bent with a curvature. The second attachment portion may have a second thickness, which is greater than the first thickness, in a first portion region of the curved portion of the window, and may have a third thickness, which is smaller than the first thickness, in a second portion region of the curved portion different from the first portion region.

The thickness of the second attachment portion in the first portion region may be increased from the first thickness to the second thickness with increasing distance from the first attachment portion. The thickness of the second attachment portion in the second portion region may be decreased from the second thickness to the third thickness with increasing distance from a border between the first portion region and the second portion region.

The window may further include a double-curved portion, which is extended from the front surface portion and is bent from the front surface portion with at least two curvatures, and the adhesive resin layer may further include a third attachment portion corresponding to the double-curved portion.

The third attachment portion of the adhesive resin layer may have a same modulus as the second attachment portion of the adhesive resin layer.

The display panel may include a main display portion, which corresponds to the first region and is configured to display an image, and a sub-display portion, which corresponds to the second region and is configured to display an image.

The display panel may be folded along a folding axis. The first region may be a non-folding region, and the second region may be a folding region.

According to an exemplary embodiment of the inventive concept, a method of fabricating a display device may include forming an adhesive resin layer on a display panel, placing a window to face the display panel, and attaching the display panel to a rear surface of the window using the adhesive resin layer. The window may include a front surface portion and a curved portion bent from the front surface portion. The forming of the adhesive resin layer on the display panel may be performed such that the adhesive resin layer is coated on a first region of the display panel, which corresponds to the front surface portion, to a first thickness, and is coated on a second region of the display panel, which corresponds to the curved portion, to a different thickness from the first thickness.

The forming of the adhesive resin layer on the display panel may include spraying an adhesive resin material onto the display panel using an inkjet method, and curing the adhesive resin material sprayed onto the display panel.

In the spraying of the adhesive resin material, a spray amount of the adhesive resin material sprayed through an inkjet head is controlled such that the adhesive resin material is sprayed on the first region of the display panel in a first spray amount and is sprayed on the second region of the display panel in a second spray amount. The first spray amount and the second spray amount may be different.

The spraying of the adhesive resin material may include spraying a first adhesive resin material having a first modulus on the first region, and spraying a second adhesive resin material having a second modulus greater than the first modulus on the second region.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1A:
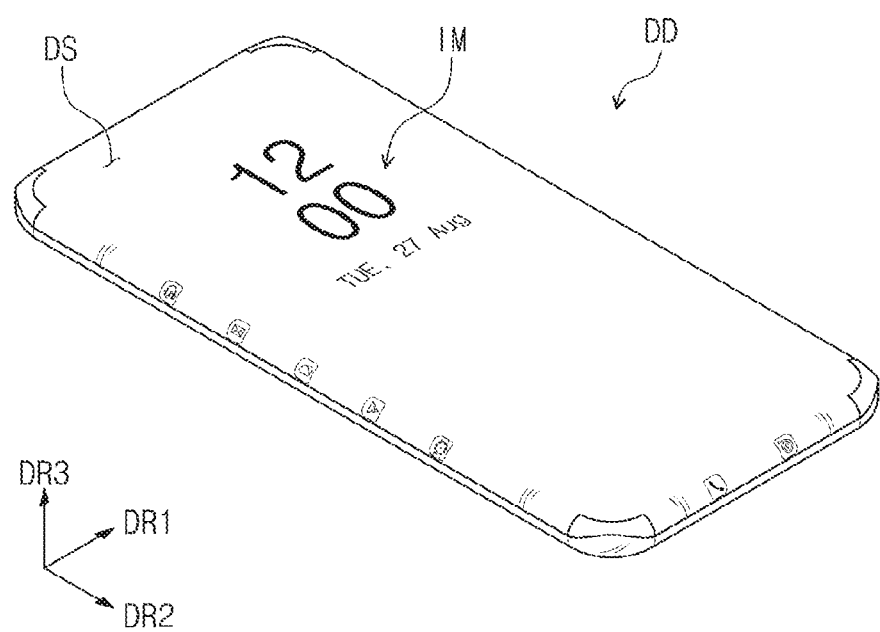
FIG. 1A is a perspective view illustrating a display device according to an exemplary embodiment of the inventive concept.

Exemplary embodiments of the inventive concept provide a display device with improved attachment reliability at a curved region.

Exemplary embodiments of the inventive concept also provide a method of fabricating the display device.

Exemplary embodiments of the inventive concept will now be described more fully hereinafter with reference to the accompanying drawings. Like reference numerals may refer to like elements throughout this application.

It should be noted that the figures are intended to illustrate the general characteristics of methods, structure, and/or materials utilized in certain exemplary embodiments and to supplement the written description provided below. These drawings are not, however, to scale and may not precisely reflect the precise structural or performance characteristics of any given exemplary embodiment of the inventive concept, and should not be interpreted as defining or limiting the range of values or properties encompassed by exemplary embodiments of the inventive concept. For example, the relative thicknesses and positioning of molecules, layers, regions, and/or structural elements may be reduced or exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on," etc.).

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the inventive concept.

Spatially relative terms, such as "beneath," "below," "lower," "above," "upper," or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein should be interpreted accordingly.

Exemplary embodiments of the inventive concept are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing.

Figure 1B:
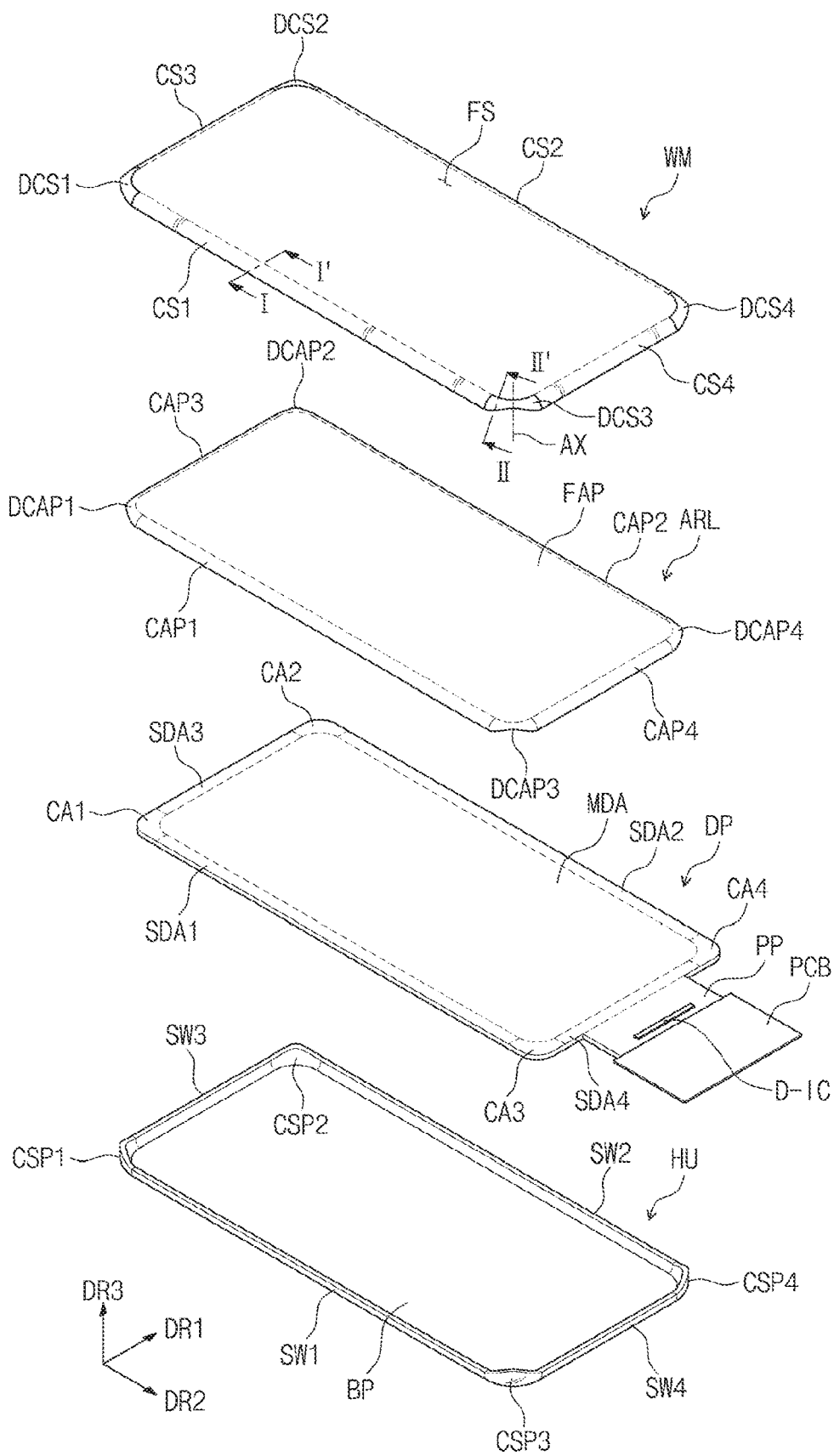
FIG. 1B is an exploded perspective view illustrating the display device of FIG. 1A according to an exemplary embodiment of the inventive concept.
Figure 2A:
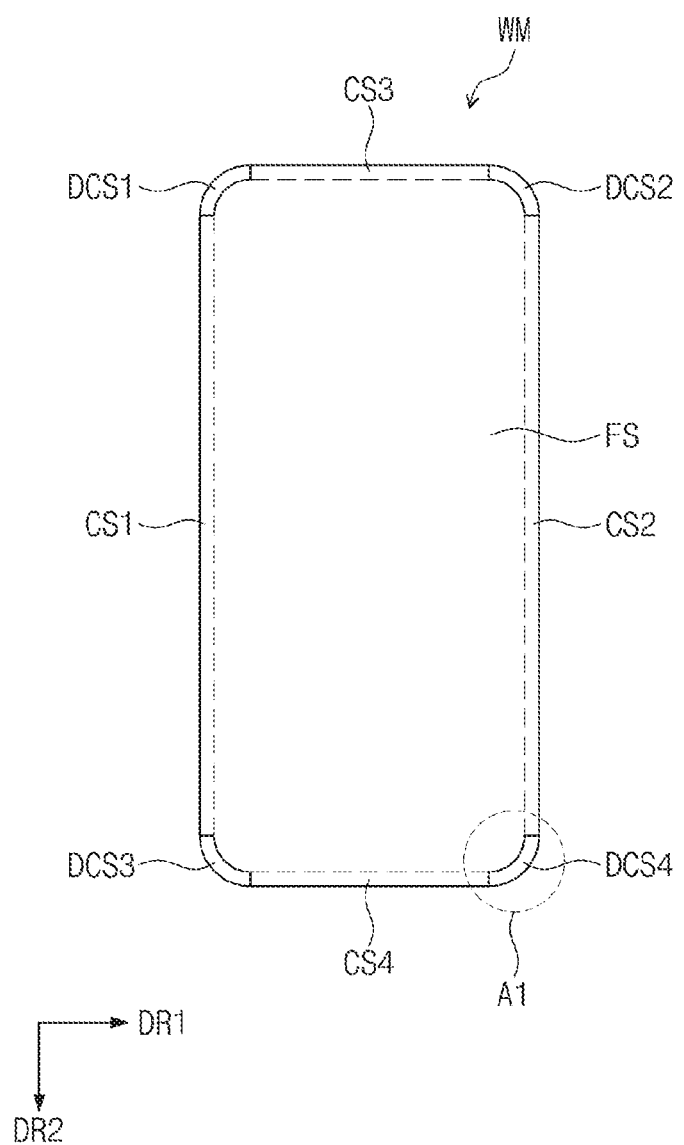
FIG. 2A is a plan view illustrating a window of FIG. 1A according to an exemplary embodiment of the inventive concept.

FIG. 1A is a perspective view illustrating a display device according to an exemplary embodiment of the inventive concept, and FIG. 1B is an exploded perspective view illustrating the display device of FIG. 1A according to an exemplary embodiment of the inventive concept. FIG. 2A is a plan view illustrating a window of FIG. 1A according to an exemplary embodiment of the inventive concept, FIG. 2B is an enlarged perspective view of a portion 'A1' of FIG. 2A according to an exemplary embodiment of the inventive concept, and FIG. 2C is a side view illustrating the display device of FIG. 1A according to an exemplary embodiment of the inventive concept.

FIGS. 1A and 1B illustrate an example in which a display device DD is a smart phone, but the inventive concept is not limited thereto. The display device DD may be used for large-sized electronic devices (e.g., television sets or monitors) or small- or medium-sized electronic devices (e.g., portable phones, tablets, car navigation systems, game machines, or smart watches).

Referring to FIGS. 1A and 1B, the display device DD may display an image IM through a display surface DS. The display device DD may include a window WM, a display panel DP, an adhesive resin layer ARL, and a housing HU. The window WM may protect a top surface of the display panel DP. The window WM may be optically transparent. Accordingly, an image displayed on the display panel DP may be provided to a user through the window WM. In other words, the display surface DS of the display device DD may be defined by the window WM. The window WM may be formed of or include at least one of glass, plastic materials, or various films.

Figure 2B:
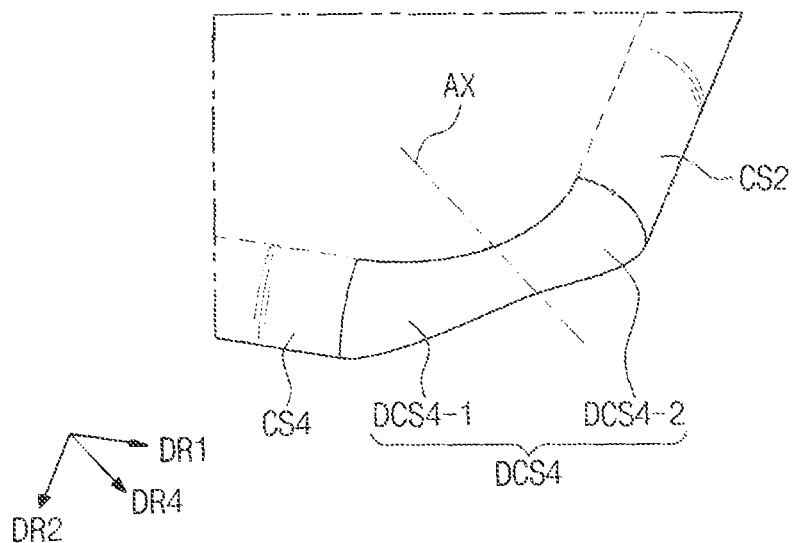
FIG. 2B is an enlarged perspective view of a portion 'A1' of FIG. 2A according to an exemplary embodiment of the inventive concept.
Figure 2C:
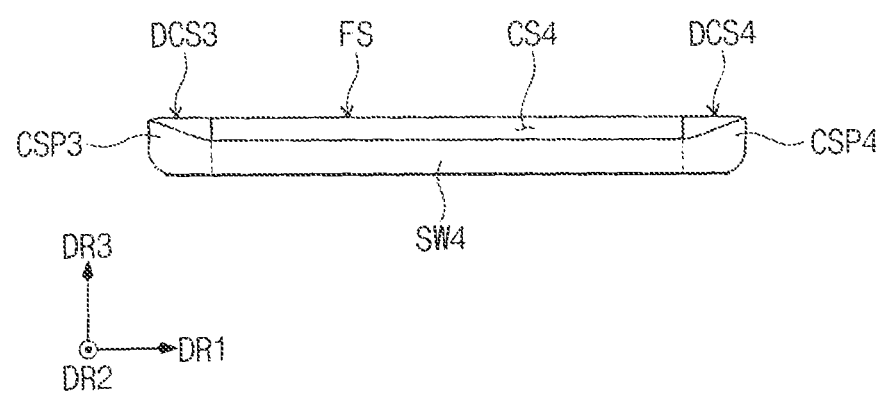
FIG. 2C is a side view illustrating the display device of FIG. 1A according to an exemplary embodiment of the inventive concept.

Referring to FIGS. 1B, 2A, and 2B, the window WM may have a curved structure including at least one curved surface. In an exemplary embodiment of the inventive concept, the window WM may include a front surface portion FS, a first curved portion CS1, a second curved portion CS2, a third curved portion CS3, and a fourth curved portion CS4. Here, the front surface portion FS, the first curved portion CS1, the second curved portion CS2, the third curved portion CS3, and the fourth curved portion CS4 may be referred to as a transmission portion, through which an image or light can pass.

In the present exemplary embodiment of the inventive concept, the front surface portion FS may be a flat surface that is substantially parallel to two different directions (e.g., a first direction DR1 and a second direction DR2). The front surface portion FS may be perpendicular to a third direction DR3. Each of the first to fourth curved portions CS1-CS4 may be bent from the front surface portion FS.

Each of the first and second curved portions CS1 and CS2 may be bent from the front surface portion FS. The first and second curved portions CS1 and CS2 may be respectively bent from first and second sides of the front surface portion FS. The first and second sides of the front surface portion FS may be substantially parallel to the second direction DR2. The first and second curved portions CS1 and CS2 may be substantially parallel to the second direction DR2 and may be substantially parallel to each other.

Each of the third and fourth curved portions CS3 and CS4 may be bent from the front surface portion FS. In particular, the third and fourth curved portions CS3 and CS4 may be respectively bent from third and fourth sides of the front surface portion FS. The third and fourth sides of the front surface portion FS may be substantially parallel to the first direction DR1. The third and fourth curved portions CS3 and CS4 may be substantially parallel to the first direction DR1 and may be substantially parallel to each other.

The first to fourth curved portions CS1-CS4 may be bent from the front surface portion FS with specific curvatures. In an exemplary embodiment of the inventive concept, the first to fourth curved portions CS1-CS4 may have substantially the same curvature. In an exemplary embodiment of the inventive concept, the first and second curved portions CS1 and CS2 may have substantially the same curvature, the third and fourth curved portions CS3 and CS4 may have substantially the same curvature, but the curvature of the first and second curved portions CS1 and CS2 may be different from that of the third and fourth curved portions CS3 and CS4.

The window WM may further include at least one double-curved portion. In an exemplary embodiment of the inventive concept, the window WM may further include a first double-curved portion DCS1, a second double-curved portion DCS2, a third double-curved portion DCS3, and a fourth double-curved portion DCS4. Each of the first to fourth double-curved portions DCS1-DCS4 may have at least two curvatures. Each of the first to fourth double-curved portions DCS1-DCS4 may have a structure in which curved surfaces with different curvatures are continuously connected to each other.

The first double-curved portion DCS1 may be disposed between the first curved portion CS1 and the third curved portion CS3 to connect the first and third curved portions CS1 and CS3. The second double-curved portion DCS2 may be disposed between the second curved portion CS2 and the third curved portion CS3 to connect the second and third curved portions CS2 and CS3. The third double-curved portion DCS3 may be disposed between the first curved portion CS1 and the fourth curved portion CS4 to connect the first and fourth curved portions CS1 and CS4. The fourth double-curved portion DCS4 may be disposed between the second curved portion CS2 and the fourth curved portion CS4 to connect the second and fourth curved portions CS2 and CS4. Here, each of the first to fourth double-curved portions DCS1-DCS4 may be referred to as a non-transmission portion, through which an image or light does not pass. In this case, the window WM may further include a light-blocking pattern, which is disposed to correspond to the first to fourth double-curved portions DCS1-DCS4.

The first to fourth double-curved portions DCS1-DCS4 may have substantially the same structure. Hereinafter, the structure of the fourth double-curved portion DCS4 will be described with reference to FIG. 2B, and the description of the structures of the remaining double-curved portions DCS1-DCS3 will be omitted. The fourth double-curved portion DCS4 may be inclined at an angle of about 45° relative to the first and second directions DR1 and DR2, and may include a first sub-double-curved surface DCS4-1 and a second sub-double-curved surface DCS4-2, which are separated from each other relative to a center axis AX passing through a center of the fourth double-curved portion DCS4. The center axis AX may extend in a fourth direction DR4 different from the first and second directions DR1 and DR2. The first sub-double-curved surface DCS4-1 may be connected to the fourth curved portion CS4, and the second sub-double-curved surface DCS4-2 may be connected to the second curved portion CS2. The first sub-double-curved surface DCS4-1 may have a curvature increasing in a direction from the center axis AX toward the fourth curved portion CS4. The second sub-double-curved surface DCS4-2 may have a curvature increasing in a direction from the center axis AX toward the second curved portion CS2.

Referring back to FIG. 1B, the display panel DP may include a display portion displaying an image. In an exemplary embodiment of the inventive concept, the display portion may include a main display portion MDA, a first sub-display portion SDA1, a second sub-display portion SDA2, a third sub-display portion SDA3, and a fourth sub-display portion SDA4. The main display portion MDA may be disposed to be substantially parallel to the front surface portion FS of the window WM and may have a shape corresponding to the front surface portion FS.

The first and second sub-display portions SDA1 and SDA2 may be respectively disposed adjacent to first and second sides of the main display portion MDA and may be respectively disposed to correspond to the first and second curved portions CS1 and CS2 of the window WM. The first and second sides of the main display portion MDA may be extended substantially parallel to the second direction DR2. The first and second sub-display portions SDA1 and SDA2 may be respectively extended from the first and second sides of the main display portion MDA. The first and second sub-display portions SDA1 and SDA2 may be curved from the main display portion MDA with a specific curvature.

The third and fourth sub-display portions SDA3 and SDA4 may be respectively disposed adjacent to third and fourth sides of the main display portion MDA and may be respectively disposed to correspond to the third and fourth curved portions CS3 and CS4 of the window WM. The third and fourth sides of the main display portion MDA may be extended substantially parallel to the first direction DR1. The third and fourth sub-display portions SDA3 and SDA4 may be respectively extended from the third and fourth sides of the main display portion MDA. The third and fourth sub-display portions SDA3 and SDA4 may be curved from the main display portion MDA with a specific curvature.

So far, the structure of the display portion according to an exemplary embodiment of the inventive concept has been described, but the inventive concept is not limited thereto. In other words, the display portion may be configured to have only one main display portion MDA, or to have the main display portion MDA and one or more sub-display portions.

In an exemplary embodiment of the inventive concept, a first image, which is displayed on the main display portion MDA, and a second image, which is displayed on the first to fourth sub-display portions SDA1, SDA2, SDA3, and SDA4, may be dependent on each other. For example, the first and second images may be combined to realize a picture, a movie scene, or a UI/UX design.

The display panel DP may further include a non-display region, which is provided near the display portion. In an exemplary embodiment of the inventive concept, the non-display region may not be used to display an image. The non-display region may be provided to enclose the display portion.

The display panel DP may further include a first corner portion CA1 a second corner portion CA2, a third corner portion CA3, and a fourth corner portion CA4. The first corner portion CA1 may be disposed between the first and third sub-display portions SDA1 and SDA3, and the second corner portion CA2 may be disposed between the second and third sub-display portions SDA2 and SDA3. In addition, the third corner portion CA3 may be disposed between the first and fourth sub-display portions SDA1 and SDA4, and the fourth corner portion CA4 may be disposed between the second and fourth sub-display portions SDA2 and SDA4. The first to fourth corner portions CA1-CA4 may be included in the non-display region, which is not used to display an image. However, the inventive concept is not limited thereto. For example, in exemplary embodiments of the inventive concept, the first to fourth corner portions CA1-CA4 may include a display portion, which is used to display an image. In this case, the first to fourth corner portions CA1-CA4 may display a black image or a specific pattern image.

Because the first to fourth sub-display portions SDA1-SDA4 are curved with a specific curvature, it may be possible to realize an improved aesthetic appearance of the display device DD and to reduce an area of the non-display region recognized by a user.

In an exemplary embodiment of the inventive concept, the display panel DP may be an organic light emitting display panel, an electrophoretic display panel, or an electrowetting display panel. Furthermore, the display panel DP may be a flexible display panel which can be curved depending on the shape of the window WM.

The adhesive resin layer ARL may attach the display panel DP to a rear surface of the window WM. The adhesive resin layer ARL may be a transparent adhesive resin layer, such as an optically clear resin (OCR). In an exemplary embodiment of the inventive concept, the adhesive resin layer ARL may be formed of or include at least one of transparent acrylic resin or a transparent urethane resin.

The adhesive resin layer ARL may include a flat attachment portion FAP, a first curved attachment portion CAP1, a second curved attachment portion CAP2, a third curved attachment portion CAP3, and a fourth curved attachment portion CAP4. The flat attachment portion FAP may be disposed between and substantially parallel to the front surface portion FS of the window WM and the main display portion MDA of the display panel DP. Accordingly, the main display portion MDA of the display panel DP may be fastened to a rear surface of the front surface portion FS of the window WM by the flat attachment portion FAP. The flat attachment portion FAP may have a substantially uniform thickness on a flat surface that is defined by the first and second directions DR1 and DR2.

The first and second curved attachment portions CAP1 and CAP2 may be disposed to correspond to the first and second curved portions CS1 and CS2, respectively, of the window WM. The first curved attachment portion CAP1 may be provided between the first curved portion CS1 of the window WM and the first sub-display portion SDA1 of the display panel DP to fasten the first sub-display portion SDA1 of the display panel DP to a rear surface of the first curved portion CS1 of the window WM. The second curved attachment portion CAP2 may be disposed between the second curved portion CS2 of the window WM and the second sub-display portion SDA2 of the display panel DP to fasten the second sub-display portion SDA2 of the display panel DP to a rear surface of the second curved portion CS2 of the window WM. The first and second curved attachment portions CAP1 and CAP2 and the flat attachment portion FAP may be provided as a single object, and each of the first and second curved attachment portions CAP1 and CAP2 may have a thickness different from the flat attachment portion FAP.

The third and fourth curved attachment portions CAP3 and CAP4 may be disposed to correspond to the third and fourth curved portions CS3 and CS4, respectively, of the window WM. The third curved attachment portion CAP3 may be disposed between the third curved portion CS3 of the window WM and the third sub-display portion SDA3 of the display panel DP to fasten the third sub-display portion SDA3 of the display panel DP to a rear surface of the third curved portion CS3 of the window WM. The fourth curved attachment portion CAP4 may be disposed between the fourth curved portion CS4 of the window WM and the fourth sub-display portion SDA4 of the display panel DP to fasten the fourth sub-display portion SDA4 of the display panel DP to a rear surface of the fourth curved portion CS4 of the window WM. The third and fourth curved attachment portions CAP3 and CAP4 and the flat attachment portion FAP may be provided as a single object, and each of the third and fourth curved attachment portions CAP3 and CAP4 may have a thickness different from the flat attachment portion FAP.

The adhesive resin layer ARL may further include a first double-curved attachment portion DCAP1, a second double-curved attachment portion DCAP2, a third double-curved attachment portion DCAP3, and a fourth double-curved attachment portion DCAP4.

The first double-curved attachment portion DCAP1 may be disposed to correspond to the first double-curved portion DCS1 of the window WM. The first double-curved attachment portion DCAP1 may be disposed between the first double-curved portion DCS1 of the window WM and the first corner portion CA1 of the display panel DP to fasten the first corner portion CA1 of the display panel DP to a rear surface of the first double-curved portion DCS1 of the window WM. The first double-curved attachment portion DCAP1 may be provided to form a single object, along with the flat attachment portion FAP, the first curved attachment portion CAP1, and the third curved attachment portion CAP3, and may include at least a portion, which has a different thickness from the flat attachment portion FAP, the first curved attachment portion CAP1, and the third curved attachment portion CAP3.

The second double-curved attachment portion DCAP2 may be disposed to correspond to the second double-curved portion DCS2 of the window WM. The second double-curved attachment portion DCAP2 may be disposed between the second double-curved portion DCS2 of the window WM and the second corner portion CA2 of the display panel DP to fasten the second corner portion CA2 of the display panel DP to a rear surface of the second double-curved portion DCS2 of the window WM. The second double-curved attachment portion DCAP2 may be provided to form a single object, along with the flat attachment portion FAP, the second curved attachment portion CAP2, and the third curved attachment portion CAP3, and may include at least a portion, which has a different thickness from the flat attachment portion FAP, the second curved attachment portion CAP2, and the third curved attachment portion CAP3.

The third double-curved attachment portion DCAP3 may be disposed to correspond to the third double-curved portion DCS3 of the window WM. The third double-curved attachment portion DCAP3 may be disposed between the third double-curved portion DCS3 of the window WM and the third corner portion CA3 of the display panel DP to fasten the third corner portion CA3 of the display panel DP to a rear surface of the third double-curved portion DCS3 of the window WM. The third double-curved attachment portion DCAP3 may be provided to form a single object, along with the flat attachment portion FAP, the first curved attachment portion CAP1, and the fourth curved attachment portion CAP4, and may include at least a portion, which has a different thickness from the flat attachment portion FAP, the first curved attachment portion CAP1, and the fourth curved attachment portion CAP4.

The fourth double-curved attachment portion DCAP4 may be disposed to correspond to the fourth double-curved portion DCS4 of the window WM. The fourth double-curved attachment portion DCAP4 may be disposed between the fourth double-curved portion DCS4 of the window WM and the fourth corner portion CA4 of the display panel DP to fasten the fourth corner portion CA4 of the display panel DP to a rear surface of the fourth double-curved portion DCS4 of the window WM. The fourth double-curved attachment portion DCAP4 may be provided to form a single object, along with the flat attachment portion FAP, the second curved attachment portion CAP2, and the fourth curved attachment portion CAP4, and may include at least a portion, which has a different thickness from the flat attachment portion FAP, the second curved attachment portion CAP2, and the fourth curved attachment portion CAP4.

The structure of the adhesive resin layer ARL will be described in more detail with reference to FIGS. 3 to 6.

Referring back to FIG. 1B, the display panel DP may further include a pad portion PP, which is extended from the fourth sub-display portion SDA4. A driving circuit D-IC and pads may be disposed on the pad portion PP of the display panel DP. The driving circuit D-IC may provide driving signals to the main display portion MDA and the first to fourth sub-display portions SDA1-SDA4 of the display panel DP. The display panel DP may be electrically connected to a printed circuit board (PCB) through the pads. In an exemplary embodiment of the inventive concept, the driving circuit D-IC may be provided in the form of a chip mounted on the printed circuit board (PCB).

The housing HU may include a bottom portion BP, a first sidewall SW1, a second sidewall SW2, a third sidewall SW3, and a fourth sidewall SW4. The first to fourth sidewalls SW1-SW4 may be extended from the bottom portion BP. The housing HU may include a containing space, which is defined by the bottom portion BP and the first to fourth sidewalls SW1-SW4 and is used to contain the display panel DP. The window WM may be combined with or to the first to fourth sidewalls SW1-SW4 of the housing HU. The first to fourth sidewalls SW1-SW4 may support the first to fourth curved portions CS1-CS4, respectively, of the window WM.

Referring to FIGS. 1B and 2C, the housing HU may further include a first corner supporting portion CSP1, a second corner supporting portion CSP2, a third corner supporting portion CSP3, and a fourth corner supporting portion CSP4. In detail, the first corner supporting portion CSP1 may be disposed between the first and third sidewalls SW1 and SW3 to support the first double-curved portion DCS1 of the window WM, and the second corner supporting portion CSP2 may be disposed between the second and third sidewalls SW2 and SW3 to support the second double-curved portion DCS2 of the window WM. The third corner supporting portion CSP3 may be disposed between the first and fourth sidewalls SW1 and SW4 to support the third double-curved portion DCS3 of the window WM, and the fourth corner supporting portion CSP4 may be disposed between the second and fourth sidewalls SW2 and SW4 to support the fourth double-curved portion DCS4 of the window WM.

Figure 3A:
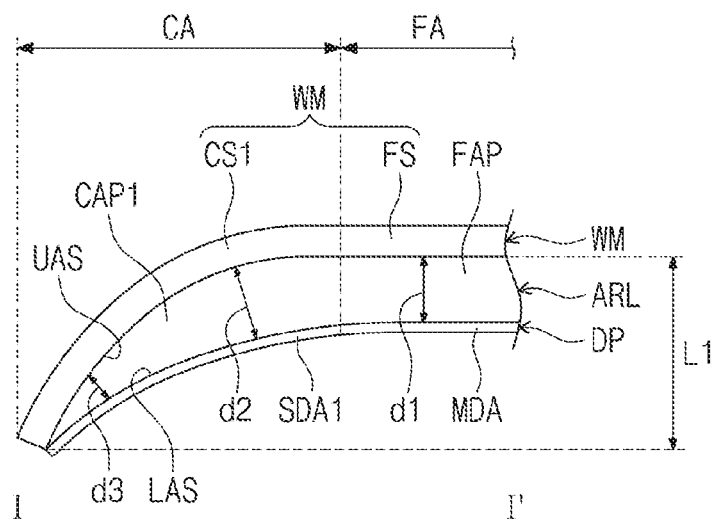
FIG. 3A is a sectional view taken along line I-I' of FIG. 1B according to an exemplary embodiment of the inventive concept.

FIG. 3A is a sectional view taken along line I-I' of FIG. 1B according to an exemplary embodiment of the inventive concept. FIG. 3A illustrates a sectional structure of the first curved attachment portion CAP1. The second to fourth curved attachment portions CAP2-CAP4 may have a structure similar to the first curved attachment portion CAP1. Thus, the first curved attachment portion CAP1 will be described in more detail below, whereas the description of the remaining curved attachment portions CAP2-CAP4 will be omitted.

Referring to FIGS. 1A, 1B, and 3A, the display device DD may include a first region FA, which corresponds to the front surface portion FS of the window WM, and a second region CA, which corresponds to the first curved portion CS1 of the window WM. The first region FA may be a flat region, in which the display device DD has a flat structure, and the second region CA may be a curved region, in which the display device DD has a curved structure.

The first curved portion CS1 of the window WM may be bent from the front surface portion FS with a first curvature. The adhesive resin layer ARL may be disposed on rear surfaces of the first curved portion CS1 and the front surface portion FS. The adhesive resin layer ARL may include the flat attachment portion FAP, which is disposed on the rear surface of the front surface portion FS, and the first curved attachment portion CAP1, which is disposed on the rear surface of the first curved portion CS1.

The flat attachment portion FAP may have a first thickness d1. In other words, the adhesive resin layer ARL may have the first thickness d1 in the first region FA. The first curved attachment portion CAP1 may have a thickness different from the first thickness d1. The first curved attachment portion CAP1 may have various thicknesses in the second region CA. Each of the flat attachment portion FAP and the first curved attachment portion CAP1 may have a thickness of about 10 μm to about 300 μm.

In detail, the first curved attachment portion CAP1 may have a second thickness d2, which is greater than the first thickness d1, in a first portion region of the second region CA, and may have a third thickness d3, which is smaller than the first thickness d1, in a second portion region of the second region CA. As an example, the thickness of the first curved attachment portion CAP1 in the first portion region may be gradually increased from the first thickness d1 to the second thickness d2 with increasing distance (e.g., in a direction) from a border between the first and second regions FA and CA. The thickness of the first curved attachment portion CAP1 in the second portion region may be gradually decreased from the second thickness d2 to the third thickness d3 with increasing distance (e.g., in a direction) from a border between the first portion region and the second portion region.

The adhesive resin layer ARL may be disposed (e.g., interposed) between the display panel DP and the window WM. In other words, the adhesive resin layer ARL may have a lower attachment surface LAS, which is attached to the display panel DP, and an upper attachment surface UAS, which is attached to the window WM. The upper attachment surface UAS may have a first curvature in the first curved attachment portion CAP1, and the lower attachment surface LAS may have a second curvature, which is smaller than the first curvature, in the first curved attachment portion CAP1.

The main display portion MDA of the display panel DP may be attached to the lower attachment surface LAS of the flat attachment portion FAP, and the first sub-display portion SDA1 of the display panel DP may be attached to the lower attachment surface LAS of the first curved attachment portion CAP1.

Since the first curved attachment portion CAP1 of the adhesive resin layer ARL has a region-dependent thickness, the first sub-display portion SDA1 of the display panel DP may have a curvature smaller than the first curved portion CS1 of the window WM. Thus, it may be possible to reduce a bending stress of the first sub-display portion SDA1 and to improve the adhesion reliability between the first sub-display portion SDA1 of the display panel DP and the first curved portion CS1 of the window WM.

Figure 3B:
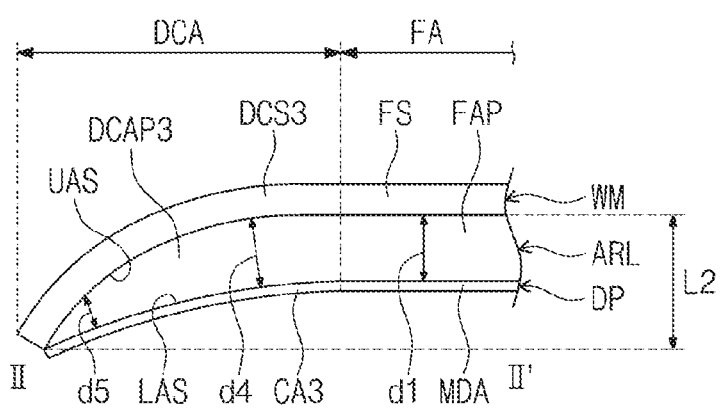
FIG. 3B is a sectional view taken along line II-II' of FIG. 1B according to an exemplary embodiment of the inventive concept.

FIG. 3B is a sectional view taken along line II-II' of FIG. 1B according to an exemplary embodiment of the inventive concept.

Referring to FIGS. 1B and 3B, the third double-curved portion DCS3 of the window WM may be bent from the front surface portion FS with at least two curvatures. The adhesive resin layer ARL may be disposed on rear surfaces of the third double-curved portion DCS3 and the front surface portion FS. The adhesive resin layer ARL may include the flat attachment portion FAP, which is disposed on the rear surface of the front surface portion FS, and the third double-curved attachment portion DCAP3, which is disposed on the rear surface of the third double-curved portion DCS3.

The third double-curved attachment portion DCAP3 of the adhesive resin layer ARL may be disposed to correspond to the third double-curved portion DCS3 of the window WM. The third double-curved attachment portion DCAP3 may be disposed between the third double-curved portion DCS3 of the window WM and the third corner portion CA3 of the display panel DP to fasten the third corner portion CA3 of the display panel DP to a rear surface of the third double-curved portion DCS3 of the window WM. The third double-curved attachment portion DCAP3 may be provided to form a single object, along with the flat attachment portion FAP, the first curved attachment portion CAP1, and the fourth curved attachment portion CAP4, and may connect the first curved attachment portion CAP1 and the fourth curved attachment portion CAP4 to each other. The third double-curved attachment portion DCAP3 may have a curvature smaller than the first and fourth curved attachment portions CAP1 and CAP4. In other words, the curvature may decrease in a direction from the first curved attachment portion CAP1 to a center of the third double-curved attachment portion DCAP3 and may decrease in a direction from the fourth curved attachment portion CAP4 to the center of the third double-curved attachment portion DCAP3.

The flat attachment portion FAP may have the first thickness d1. In other words, the adhesive resin layer ARL may have the first thickness d1 in the first region FA. The third double-curved attachment portion DCAP3 may have a thickness that is dependent on a curvature (e.g., a curvature-dependent thickness). In other words, the third double-curved attachment portion DCAP3 may have a thickness different from the first thickness d1. The third double-curved attachment portion DCAP3 may have various thicknesses in a third region DCA. The third region DCA may be a double-curved region, in which the window WM is bent with two or more curvatures.

For example, the third double-curved attachment portion DCAP3 may have a thickness greater than the first thickness d1 in a specific region. In detail, the third double-curved attachment portion DCAP3 may have a fourth thickness d4, which is greater than the first thickness d1, in a first portion region of the third region DCA and may have a fifth thickness d5, which is smaller than the first thickness d1, in a second portion region of the third region DCA. As an example, the thickness of the third double-curved attachment portion DCAP3 in the first portion region may be gradually increased from the first thickness d1 to the fourth thickness d4 in a direction from a border between the first region FA and the third region DCA. The thickness of the third double-curved attachment portion DCAP3 in the second portion region may be gradually decreased from the fourth thickness d4 to the fifth thickness d5 in a direction from a border between the first portion region and the second portion region.

In the third double-curved attachment portion DCAP3 of the adhesive resin layer ARL, the curvature of the upper attachment surface UAS may be decreased with decreasing distance from (e.g., the closer to) the center axis AX of the third double-curved attachment portion DCAP3. The curvature of the lower attachment surface LAS may be smaller than the curvature of the upper attachment surface UAS and may be decreased with decreasing distance from (e.g., the closer to) the center axis AX of the third double-curved attachment portion DCAP3.

The third corner portion CA3 of the display panel DP may be disposed to correspond to the third double-curved portion DCS3 of the window WM, and the third corner portion CA3 may be attached to the third double-curved portion DCS3 by the third double-curved attachment portion DCAP3. The third corner portion CA3 of the display panel DP may have a curvature that is smaller than the third double-curved portion DCS3 of the window WM.

Since the third double-curved attachment portion DCAP3 of the adhesive resin layer ARL has a region-dependent thickness, the third corner portion CA3 of the display panel DP may have a curvature that is smaller than the third double-curved portion DCS3 of the window WM. Thus, it may be possible to reduce a bending stress of the third corner portion CA3 and to improve the adhesion reliability between the third corner portion CA3 of the display panel DP and the third double-curved portion DCS3 of the window WM.

A height difference between an end of the first curved portion CS1 of the window WM and the front surface portion FS of the window WM may be referred to as "L1", as shown in FIG. 3A. In an exemplary embodiment of the inventive concept, the height difference L1 between the end of the first curved portion CS1 and the front surface portion FS may range from about 10 μm to 500 μm. In addition, a height difference between an end of the third double-curved portion DCS3 of the window WM and the front surface portion FS of the window WM may be referred to as "L2", as shown in FIG. 3B. In an exemplary embodiment of the inventive concept, the height difference L2 between the end of the third double-curved portion DCS3 and the front surface portion FS may be smaller than the height difference L1 between the end of the first curved portion CS1 and the front surface portion FS.

Figure 4A:
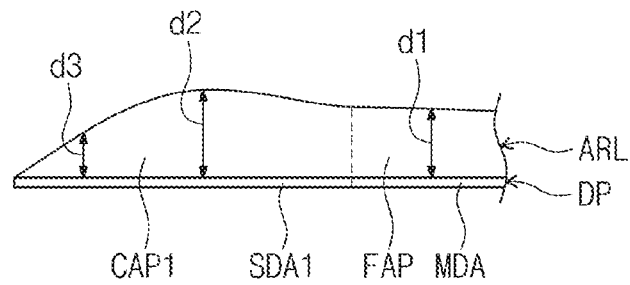
FIGS. 4A to 4C are diagrams illustrating a process of combining a window with a display panel according to an exemplary embodiment of the inventive concept.
Figure 4B:
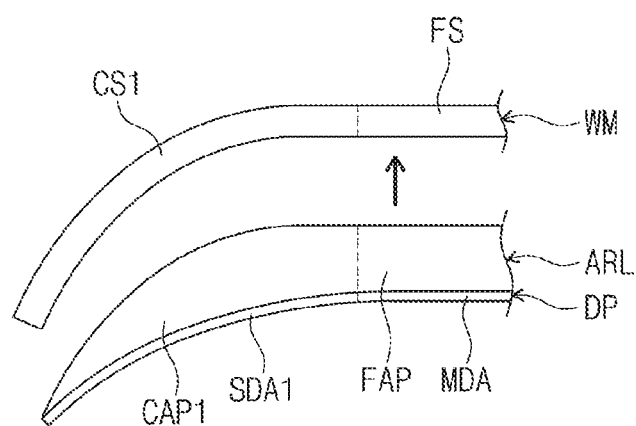
Figure 4C:
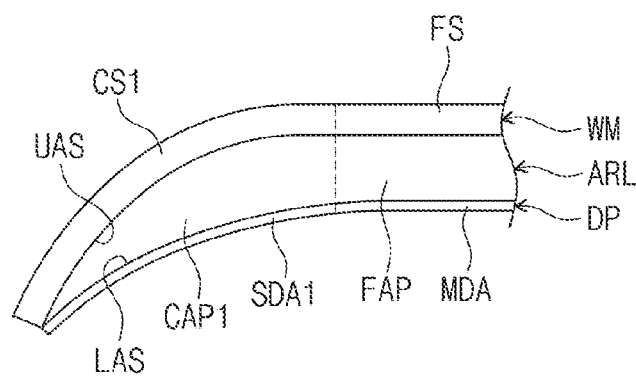
Figure 5:
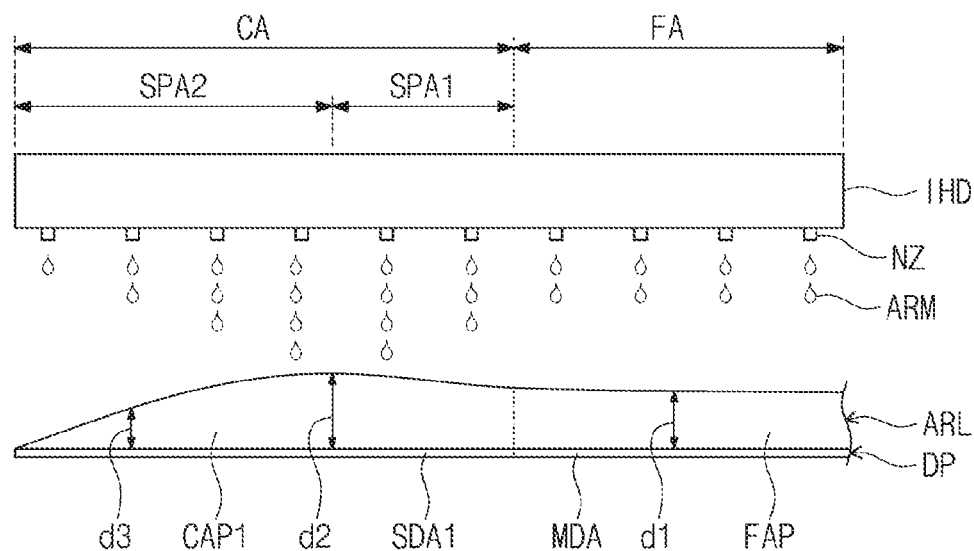
FIG. 5 is a schematic diagram illustrating a process of spraying an adhesive resin material, according to an exemplary embodiment of the inventive concept.

FIGS. 4A to 4C are diagrams illustrating a process of combining a window with a display panel according to an exemplary embodiment of the inventive concept, and FIG. 5 is a schematic diagram illustrating a process of spraying an adhesive resin material, according to an exemplary embodiment of the inventive concept.

Referring to FIG. 4A, the adhesive resin layer ARL may be coated on the display panel DP including the main display portion MDA and the first sub-display portion SDA1. The adhesive resin layer ARL may include the flat attachment portion FAP corresponding to the main display portion MDA and the first curved attachment portion CAP1 corresponding to the first sub-display portion SDA1.

The flat attachment portion FAP may have the first thickness d1, and the first curved attachment portion CAP1 may have a thickness different from the first thickness d1. The first curved attachment portion CAP1 may have the second thickness d2 greater than the first thickness d1 in a first region and the third thickness d3 smaller than the first thickness d1 in a second region. As an example, in the first region, the thickness of the first curved attachment portion CAP1 may be gradually increased from the first thickness d1 to the second thickness d2 with increasing distance (e.g., in a direction) from the flat attachment portion FAP. In the second region, the thickness of the first curved attachment portion CAP1 may be gradually decreased from the second thickness d2 to the third thickness d3 with increasing distance from the flat attachment portion FAP.

Referring to FIG. 4B, the window WM may face the display panel DP. The window WM may be disposed to face the display panel DP with the adhesive resin layer ARL interposed therebetween. The front surface portion FS of the window WM may face the main display portion MDA of the display panel DP, and the first curved portion CS1 of the window WM may face the first sub-display portion SDA1 of the display panel DP.

Here, the first sub-display portion SDA1 of the display panel DP and the first curved attachment portion CAP1 of the adhesive resin layer ARL may be bent from the main display portion MDA of the display panel DP and the flat attachment portion FAP of the adhesive resin layer ARL, respectively.

As shown in FIG. 4C, the window WM and the display panel DP may be combined with each other by the adhesive resin layer ARL. The adhesive resin layer ARL may be disposed between the window WM and the display panel DP. The upper attachment surface UAS of the adhesive resin layer ARL may be attached to the rear surface of the window WM, and the lower attachment surface LAS of the adhesive resin layer ARL may be attached to the top surface of the display panel DP.

The main display portion MDA of the display panel DP may be attached to a rear surface of the front surface portion FS of the window WM by the flat attachment portion FAP of the adhesive resin layer ARL, and the first sub-display portion SDA1 of the display panel DP may be attached to a rear surface of the first curved portion CS1 of the window WM by the first curved attachment portion CAP1 of the adhesive resin layer ARL.

Referring to FIG. 5, an inkjet method may be used to coat the display panel DP with the adhesive resin layer ARL.

An inkjet head IHD may be disposed on the display panel DP. An adhesive resin material ARM may be stored in the inkjet head IHD. In an exemplary embodiment of the inventive concept, the adhesive resin material ARM may include a transparent acrylic resin material or a transparent urethane resin material.

The inkjet head IHD may include a spray nozzle NZ, which is used to spray the adhesive resin material ARM. When a spray process starts, the adhesive resin material ARM may be sprayed onto the display panel DP through the spray nozzle NZ.

In the spray process, a spray amount of the adhesive resin material ARM sprayed from the inkjet head IHD may be controlled depending on position. For example, the adhesive resin material ARM may be sprayed on the first region FA, which corresponds to the main display portion MDA of the display panel DP, in a first spray amount, whereas the adhesive resin material ARM may be sprayed on the second region CA, which corresponds to the first sub-display portion SDA1 of the display panel DP, in a different spray amount from the first spray amount.

In detail, the second region CA may be classified into a first spray region SPA1 and a second spray region SPA2. With regard to a spray amount by a single nozzle, the adhesive resin material ARM may be sprayed on the first spray region SPA1 in a second spray amount greater than the first spray amount, and the adhesive resin material ARM may be sprayed on the second spray region SPA2 in a third spray amount less than the first spray amount.

In an exemplary embodiment of the inventive concept, the second spray amount on the first spray region SPA1 may be gradually increased with increasing distance from the first region FA. The third spray amount on the second spray region SPA2 may be gradually decreased with increasing distance from the first region FA.

When the spray process is finished, the adhesive resin material ARM sprayed on the display panel DP may be cured to form the adhesive resin layer ARL.

As a result of the above-described spray process, the flat attachment portion FAP of the adhesive resin layer ARL may be formed to have the first thickness d1, and the first curved attachment portion CAP1 may be formed to have a thickness different from the first thickness d1. In particular, the first curved attachment portion CAP1 may have the second thickness d2, which is greater than the first thickness d1, in the first spray region SPA1, and may have the third thickness d3, which is smaller than the first thickness d1, in the second spray region SPA2.

Figure 6:
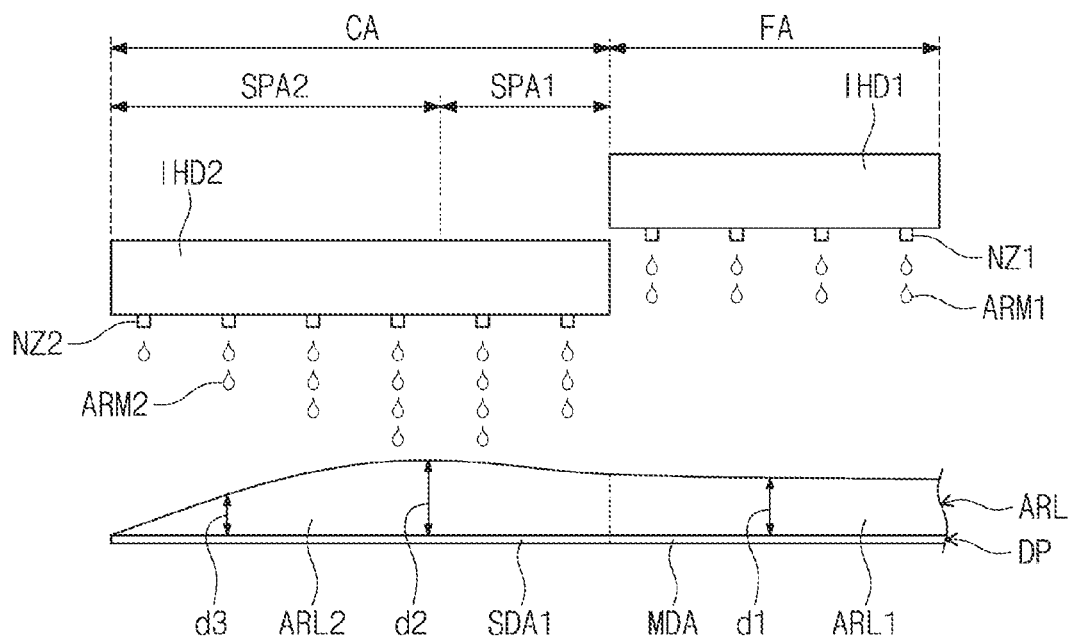
FIG. 6 is a schematic diagram illustrating a process of spraying an adhesive resin material, according to an exemplary embodiment of the inventive concept.

FIG. 6 is a schematic diagram illustrating a process of spraying an adhesive resin material, according to an exemplary embodiment of the inventive concept.

Referring to FIG. 6, a first inkjet head IHD1 and a second inkjet head IHD2 may be disposed on the display panel DP. A first adhesive resin material ARM1 may be stored in the first inkjet head IHD1, and a second adhesive resin material ARM2 may be stored in the second inkjet head IHD2. The second adhesive resin material ARM2 may have a different modulus from the first adhesive resin material ARM1. In an exemplary embodiment of the inventive concept, the modulus of the second adhesive resin material ARM2 may be higher than the first adhesive resin material ARM1.

The first inkjet head IHD1 may be disposed to correspond to the main display portion MDA of the display panel DP, and the second inkjet head IHD2 may be disposed to correspond to the first sub-display portion SDA1 of the display panel DP. The first inkjet head IHD1 may include a first spray nozzle NZ1, which is used to spray the first adhesive resin material ARM1. When the spray process starts, the first adhesive resin material ARM1 may be sprayed onto the display panel DP through the first spray nozzle NZ1. The first inkjet head IHD1 may be configured to spray the first adhesive resin material ARM1 in the first spray amount. The second inkjet head IHD2 may include a second spray nozzle NZ2, which is used to spray the second adhesive resin material ARM2. When the spray process starts, the second adhesive resin material ARM2 may be sprayed onto the display panel DP through the second spray nozzle NZ2. The second inkjet head IHD2 may be configured to spray the second adhesive resin material ARM2 in a spray amount different from the first spray amount. To reduce a process time, the spray process using the first inkjet head IHD1 and the spray process using the second inkjet head IHD2 may be performed at substantially the same time.

In the spray process, the spray amount of the second adhesive resin material ARM2 sprayed from the second inkjet head IHD2 may be controlled depending on position. For example, the second inkjet head IHD2 may be classified into the first spray region SPA1 and the second spray region SPA2. With regard to a spray amount by a single nozzle, the second adhesive resin material ARM2 may be sprayed on the first spray region SPA1 in the second spray amount greater than the first spray amount, and the second adhesive resin material ARM2 may be sprayed on the second spray region SPA2 in the third spray amount less than the first spray amount.

In an exemplary embodiment of the inventive concept, the second spray amount on the first spray region SPA1 may be gradually increased with increasing distance from the first inkjet head IHD1. The third spray amount on the second spray region SPA2 may be gradually decreased with increasing distance from the first inkjet head IHD1.

Accordingly, a first adhesive resin layer ARL1 having a first modulus and a second adhesive resin layer ARL2 having a second modulus may be formed on the display panel DP. The first adhesive resin layer ARL1 may be formed on the main display portion MDA of the display panel DP, and the second adhesive resin layer ARL2 may be formed on the first sub-display portion SDA1 of the display panel DP. Therefore, the flat attachment portion FAP (refer to FIG. 5) (e.g., the first adhesive resin layer ARL1) and the first curved attachment portion CAP1 (refer to FIG. 5) (e.g., the second adhesive resin layer ARL2) may have different moduli from each other. In an exemplary embodiment of the inventive concept, the second modulus of the second adhesive resin layer ARL2 may be greater than the first modulus of the first adhesive resin layer ARL1. In an exemplary embodiment of the inventive concept, the first modulus may range from about 0.01 MPa to about 10 MPa, and the second modulus may range from about 1 MPa to about 200 MPa.

Referring to FIGS. 1B and 6, since the second adhesive resin layer ARL2 having a high modulus is disposed on the first curved portion CS1 whose curvature is greater than the front surface portion FS of the window WM, it may be possible to reduce a stress, which is exerted on the first sub-display portion SDA1 of the display panel DP combined with the first curved portion CS1.

In addition, the first adhesive resin layer ARL1 may have a uniform thickness of the first thickness d1, and the second adhesive resin layer ARL2 may have a non-uniform thickness. The second adhesive resin layer ARL2 may have a thickness different from the first adhesive resin layer ARL1. In particular, the second adhesive resin layer ARL2 may have the second thickness d2, which is greater than the first thickness d1, in the first spray region SPA1, and may have the third thickness d3, which is smaller than the first thickness d1, in the second spray region SPA2.

Due to this structure of the second adhesive resin layer ARL2, the first sub-display portion SDA1 of the display panel DP may have a curvature, which is smaller than the first curved portion CS1 of the window WM, even when the first sub-display portion SDA1 of the display panel DP is combined with the first curved portion CS1 of the window WM. Thus, it may be possible to reduce a stress that is exerted on the first sub-display portion SDA1 of the display panel DP.

Figure 7A:
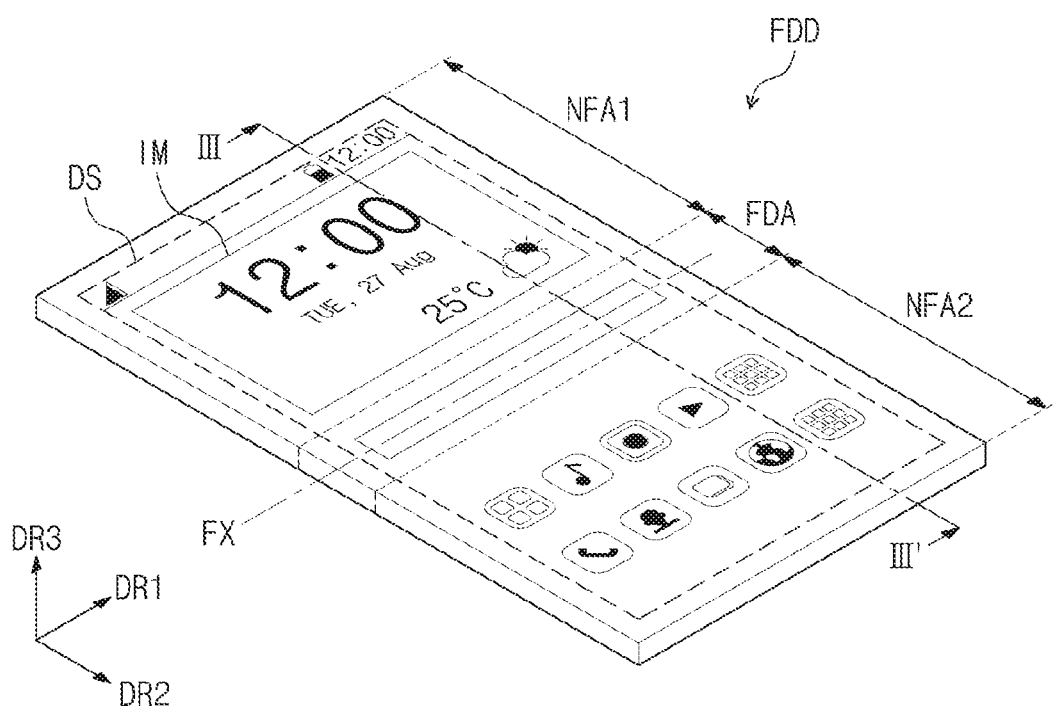
FIG. 7A is a perspective view illustrating a foldable display device according to an exemplary embodiment of the inventive concept.
Figure 7B:
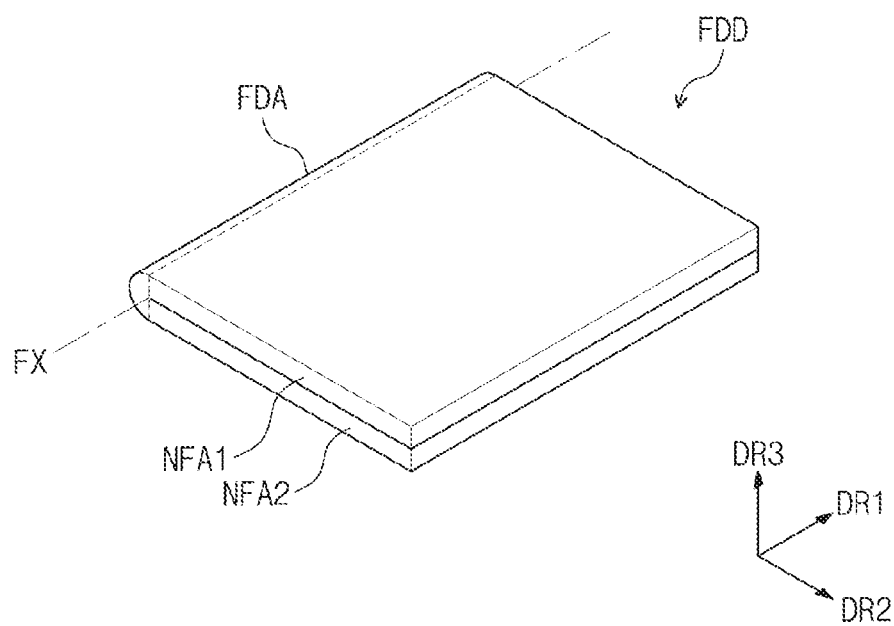
FIG. 7B is a perspective view illustrating an in-folding state of the foldable display device of FIG. 7A according to an exemplary embodiment of the inventive concept.
Figure 7C:
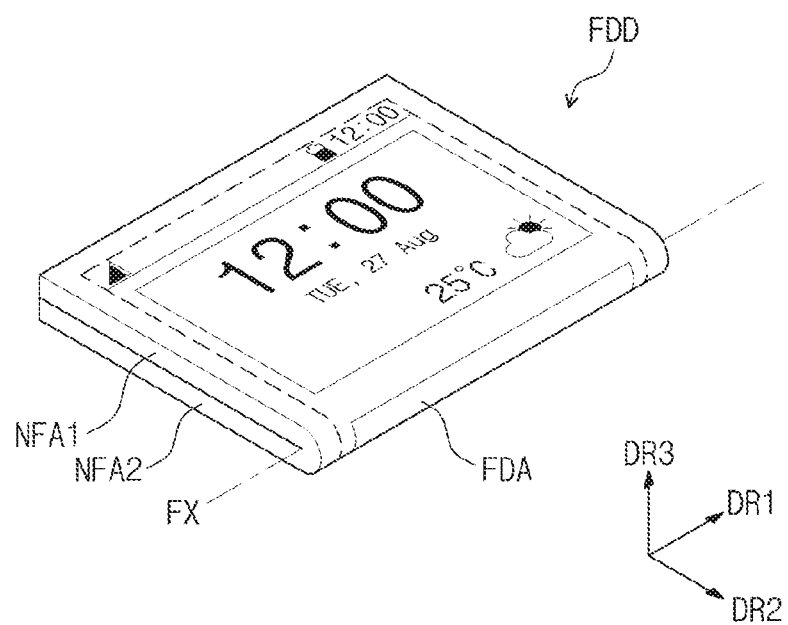
FIG. 7C is a perspective view illustrating an out-folding state of the foldable display device of FIG. 7A according to an exemplary embodiment of the inventive concept.

FIG. 7A is a perspective view illustrating a foldable display device according to an exemplary embodiment of the inventive concept, FIG. 7B is a perspective view illustrating an in-folding state of the foldable display device of FIG. 7A according to an exemplary embodiment of the inventive concept, and FIG. 7C is a perspective view illustrating an out-folding state of the foldable display device of FIG. 7A according to an exemplary embodiment of the inventive concept.

As shown in FIGS. 7A to 7C, a foldable display device FDD may include a first region and a second region. The first region may include a plurality of non-folding regions NFA1 and NFA2, and the second region may include a folding region FDA. The first region may include first and second non-folding regions NFA1 and NFA2. The folding region FDA may be disposed between the first and second non-folding regions NFA1 and NFA2. The foldable display device FDD shown in FIGS. 7A to 7C may be just one of possible examples, and in exemplary embodiments of the inventive concept, the foldable display device FDD may be configured to include two or more folding regions.

A folding axis FX may be defined in the folding region FDA. The folding axis FX may be a rotating axis, along which the foldable display device FDD is folded, and may be realized by one (e.g., a hinge axle) of mechanical parts constituting the foldable display device FDD.

The foldable display device FDD may include the display surface DS displaying the image IM. The display surface DS may be classified into a display surface of the first non-folding region NFA1, a display surface of the second non-folding region NFA2, and a display surface of the folding region FDA. Hereinafter, the first direction DR1 and the second direction DR2 may define the display surface DS in an unfolded state. The third direction DR3 may indicate a thickness direction of the foldable display device FDD. In addition, the first direction DR1 may indicate an extension direction of the folding axis FX.

As shown in FIG. 7B, the foldable display device FDD may be folded along the folding axis FX in such a way that the display surface of the first non-folding region NFA1 faces the display surface of the second non-folding region NFA2. Hereinafter, a folding way of the foldable display device FDD, in which display surfaces of different non-folding regions face each other, will be referred to as an "in-folding manner". In the present exemplary embodiment of the inventive concept, the first non-folding region NFA1 may be rotated along the folding axis FX in a clockwise direction, such that the foldable display device FDD is folded in the in-folding manner to be in an in-fold mode. The folding axis FX may be located on a center of the foldable display device FDD, when viewed in the second direction DR2, and in this case, the first and second non-folding regions NFA1 and NFA2 may be aligned to each other, in the in-fold mode of the foldable display device FDD.

As shown in FIG. 7C, the foldable display device FDD may be folded along the folding axis FX in such a way that the display surface of the first non-folding region NFA1 and the display surface of the second non-folding region NFA2 are exposed to the outside. Hereinafter, a folding way of the foldable display device FDD, in which the display surfaces of the different non-folding regions NFA1 and NFA2 are exposed to the outside, will be referred to as an "out-folding manner".

The foldable display device FDD may display the image IM, when the display surface of the first non-folding region NFA1 and the display surface of the second non-folding region NFA2 are exposed to the outside. In addition, the display surface of the folding region FDA exposed to the outside may also display the image IM. The foldable display device FDD in the unfolded state may display the image IM, as shown in FIG. 7A. The first non-folding region NFA1, the second non-folding region NFA2, and the folding region FDA may be configured to display images, which provide independent pieces of information to a user, or to display different portions of a single image, which provides a piece of information to the user.

Figure 8A:
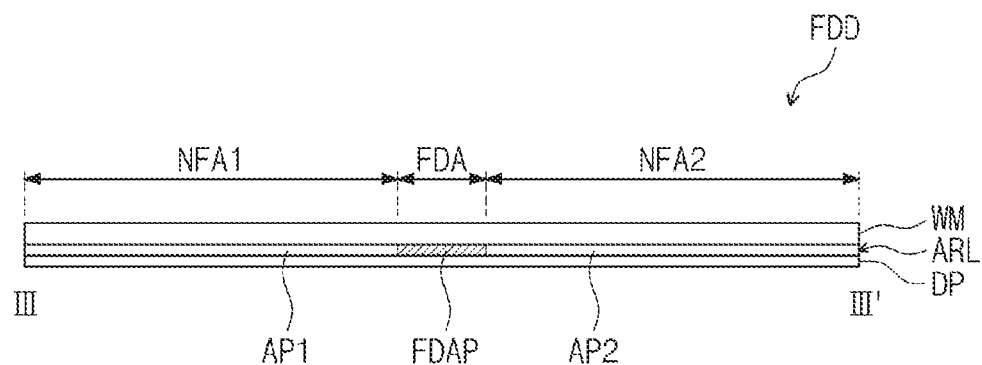
FIG. 8A is a sectional view taken along line of FIG. 7A according to an exemplary embodiment of the inventive concept.
Figure 8B:
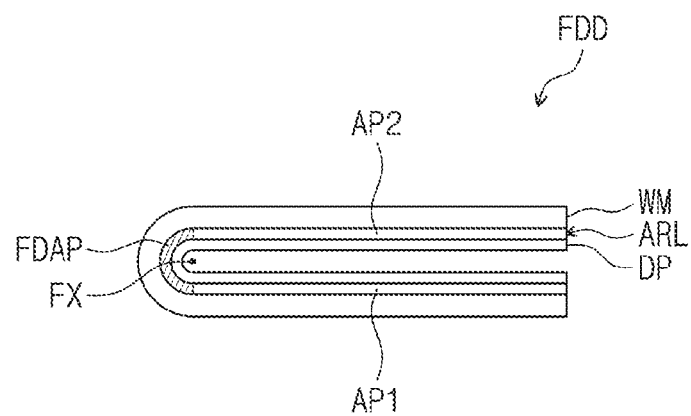
FIG. 8B is a sectional view illustrating an out-folding state of the foldable display device of FIG. 8A according to an exemplary embodiment of the inventive concept.

FIG. 8A is a sectional view taken along line III-III' of FIG. 7A according to an exemplary embodiment of the inventive concept, and FIG. 8B is a sectional view illustrating an out-folding state of the foldable display device of FIG. 8A according to an exemplary embodiment of the inventive concept.

Referring to FIGS. 8A and 8B, the foldable display device FDD may include the window WM, the display panel DP, and the adhesive resin layer ARL.

The window WM may protect the top surface of the display panel DP. The window WM may be optically transparent. The window WM may be formed of a flexible material. Thus, the window WM may be folded or unfolded along the folding axis FX. For example, the window WM may be a plastic plate or a resin film including an organic material.

The display panel DP may be disposed on the rear surface of the window WM, and the display panel DP and the window WM may be combined with each other by the adhesive resin layer ARL. The adhesive resin layer ARL may include first and second attachment portions AP1 and AP2, which correspond to the first and second non-folding regions NFA1 and NFA2, respectively, and a folding attachment portion FDAP, which corresponds to the folding region FDA.

The folding attachment portion FDAP may have a modulus different from the first and second attachment portions AP1 and AP2. In detail, the first and second attachment portions AP1 and AP2 may have a first modulus, and the folding attachment portion FDAP may have a second modulus. In an exemplary embodiment of the inventive concept, the second modulus of the folding attachment portion FDAP may be greater than the first modulus of the first and second attachment portions AP1 and AP2. In an exemplary embodiment of the inventive concept, the first modulus may range from about 0.01 MPa to about 10 MPa, and the second modulus may range from about 1 MPa to about 200 MPa.

Figure 9:
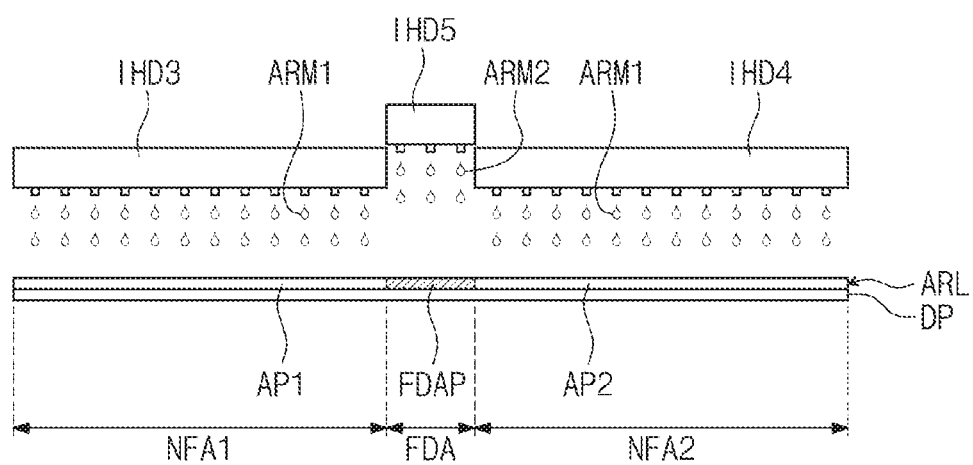
FIG. 9 is a sectional view illustrating a process of forming an adhesive resin layer of FIG. 8A according to an exemplary embodiment of the inventive concept.

FIG. 9 is a sectional view illustrating a process of forming an adhesive resin layer of FIG. 8A according to an exemplary embodiment of the inventive concept.

Referring to FIG. 9, a third inkjet head IHD3, a fourth inkjet head IHD4, and a fifth inkjet head IHD5 may be disposed on the display panel DP. The first adhesive resin material ARM1 may be stored in the third and fourth inkjet heads IHD3 and IHD4, and the second adhesive resin material ARM2 may be stored in the fifth inkjet head IHD5. The second adhesive resin material ARM2 may have a different modulus from the first adhesive resin material ARM1. In an exemplary embodiment of the inventive concept, the modulus of the second adhesive resin material ARM2 may be higher than the first adhesive resin material ARM1.

The third and fourth inkjet heads IHD3 and IHD4 may be disposed to correspond to the first and second non-folding regions NFA1 and NFA2, respectively, of the display panel DP, and the fifth inkjet head IHD5 may be disposed to correspond to the folding region FDA of the display panel DP. When the spraying process starts, the third and fourth inkjet heads IHD3 and IHD4 may spray the first adhesive resin material ARM1 onto the first and second non-folding regions NFA1 and NFA2 of the display panel DP. The fifth inkjet head IHD5 may spray the second adhesive resin material ARM2 onto the folding region FDA of the display panel DP. To reduce a process time, the spray process using the third and fourth inkjet heads IHD3 and IHD4 and the spray process using the fifth inkjet head IHD5 may be performed at substantially the same time.

When the spray process is finished, the first and second adhesive resin materials ARM1 and ARM2 sprayed on the display panel DP may be cured to form the adhesive resin layer ARL.

The adhesive resin layer ARL may include the first and second attachment portions AP1 and AP2 having the first modulus and the folding attachment portion FDAP having the second modulus. The first and second attachment portions AP1 and AP2 may be formed on the first and second non-folding regions NFA1 and NFA2 of the display panel DP, and the folding attachment portion FDAP may be formed on the folding region FDA of the display panel DP. The second modulus of the folding attachment portion FDAP may be greater than the first modulus of the first and second attachment portions AP1 and AP2. In an exemplary embodiment of the inventive concept, the first modulus may range from about 0.01 MPa to about 10 MPa, and the second modulus may range from about 1 MPa to about 200 MPa.

In the case where, as described above, the folding attachment portion FDAP having a high modulus is disposed on the folding region FDA, it may be possible to reduce a stress that is exerted on the folding region FDA of the display panel DP when the foldable display device FDD is folded.

According to exemplary embodiments of the inventive concept, an adhesive resin layer may include a first attachment portion, which is provided on a front surface portion of a window, and a second attachment portion, which is provided on a curved portion of a window. Here, the first and second attachment portions may be formed to have different thicknesses, and this makes it possible to reduce the chance of a bonding failure, which may occur at a bending portion of a display panel combined with the curved portion of the window.

In addition, the second attachment portion has a modulus greater than the first attachment portion. In this case, it may be possible to reduce a bending stress at the bending portion of the display panel.

While the inventive concept has been shown and described with reference to exemplary embodiments thereof, it will be understood by one of ordinary skill in the art that variations in form and details may be made thereto without departing from the spirit and scope of the inventive concept as set forth by the attached claims.

What is claimed is:

1. A display device, comprising:
   a window including a front surface portion and a curved portion, wherein the front surface portion comprises a flat surface and wherein the curved portion is extended from an edge of the front surface portion and is bent with a curvature;
   a display panel combined with the window, and comprising a first region corresponding to the front surface portion and a second region corresponding to the curved portion; and
   an adhesive resin layer interposed between the window and the display panel to fasten the display panel to a rear surface of the window,
   wherein the adhesive resin layer comprises a first attachment portion in contact with the flat surface and a second attachment portion in contact with the curved portion,
   wherein a thickness of the second attachment portion is different from a first thickness of the first attachment portion,
   wherein the second attachment portion has a second thickness, which is greater than the first thickness, in a first portion region of the curved portion of the window, and has a third thickness, which is smaller than the first thickness, in a second portion region of the curved portion different from the first portion region, and
   wherein the first portion region is disposed between the second portion region and the first attachment portion.

2. The display device of claim 1, wherein the thickness of the second attachment portion in the first portion region is increased from the first thickness to the second thickness with increasing distance from the first attachment portion, and
   the thickness of the second attachment portion in the second portion region is decreased from the second thickness to the third thickness with increasing distance from a border between the first portion region and the second portion region.

3. The display device of claim 1, wherein the display panel comprises a main display portion, which corresponds to the first region and is configured to display an image, and a sub-display portion, which corresponds to the second region and is configured to display an image.

4. The display device of claim 1, wherein the window further comprises a double-curved portion, which is extended from the front surface portion and is bent from the front surface portion with at least two curvatures, and
   the adhesive resin layer further comprises a third attachment portion corresponding to the double-curved portion.

5. The display device of claim 4, wherein the double-curved portion of the window is provided between first and second curved portions, which are located adjacent to each other, and connects the first and second curved portions to each other, and
   the double-curved portion comprises:
      a first sub-double-curved surface whose curvature is increased in a direction from a center axis, which is located at a center of the double-curved portion, toward the first curved portion; and a second sub-double-curved surface whose curvature is increased in a direction from the center axis toward the second curved portion.

6. The display device of claim 5, wherein the third attachment portion of the adhesive resin layer has a fourth thickness, which is different from the first thickness, in a third portion region corresponding to the first sub-double-curved surface, and has a fifth thickness, which is different from the first thickness, in a fourth portion region corresponding to the second sub-double-curved surface.

7. A display device, comprising:
a window including a front surface portion and a curved portion, wherein the front surface portion comprises a flat surface and wherein the curved portion is extended from an edge of the front surface portion and is bent with a curvature;
a display panel combined with the window, and comprising a first region corresponding to the front surface portion and a second region corresponding to the curved portion; and
an adhesive resin layer interposed between the window and the display panel to fasten the display panel to a rear surface of the window,
wherein the adhesive resin layer comprises a first attachment portion in contact with the first region and a second attachment portion in contact with the second region,
wherein the first and second attachment portions of the adhesive resin layer have different moduli from each other,
wherein the second attachment portion has a second thickness, which is greater than a first thickness of the first attachment portion, in a first portion region of the curved portion of the window, and has a third thickness, which is smaller than the first thickness, in a second portion region of the curved portion different from the first portion region, and
wherein the first portion region is disposed between the second portion region and the first attachment portion.

8. The display device of claim 7, wherein the first attachment portion of the adhesive resin layer has a first modulus, and
the second attachment portion has a second modulus that is greater than the first modulus.

9. The display device of claim 7, wherein a thickness of the second attachment portion in the first portion region is increased from the first thickness to the second thickness with increasing distance from the first attachment portion, and
the thickness of the second attachment portion in the second portion region is decreased from the second thickness to the third thickness with increasing distance from a border between the first portion region and the second portion region.

10. The display device of claim 7, wherein the window further comprises a double-curved portion, which is extended from the front surface portion and is bent from the front surface portion with at least two curvatures, and
the adhesive resin layer further comprises a third attachment portion corresponding to the double-curved portion.

11. The display device of claim 10, wherein the third attachment portion of the adhesive resin layer has a same modulus as the second attachment portion of the adhesive resin layer.

12. The display device of claim 7, wherein the display panel comprises a main display portion, which corresponds to the first region and is configured to display an image, and a sub-display portion, which corresponds to the second region and is configured to display an image.

13. The display device of claim 7, wherein the display panel is folded along a folding axis,
the first region is a non-folding region, and
the second region is a folding region.

14. A method of fabricating a display device, comprising:
forming an adhesive resin layer on a display panel;
placing a window to face the display panel, wherein the window includes a front surface portion and a curved portion, wherein the front surface portion comprises a flat surface and wherein the curved portion is extended from an edge of the front surface portion and is bent with a curvature from the front surface portion; and
attaching the display panel to a rear surface of the window using the adhesive resin layer, wherein the display panel comprises a first region corresponding to the front surface portion and a second region corresponding to the curved portion,
wherein the forming of the adhesive resin layer on the display panel is performed such that the adhesive resin layer is coated on a first region of the display panel, which corresponds to the front surface portion, to a first thickness, and is coated on a second region of the display panel, which corresponds to the curved portion, to a different thickness from the first thickness,
wherein the adhesive resin layer comprises a first attachment portion in contact with the flat surface and a second attachment portion in contact with the curved portion, wherein a thickness of the second attachment portion is different from a first thickness of the first attachment portion, wherein the second attachment portion has a second thickness, which is greater than the first thickness, in a first portion region of the curved portion of the window, and has a third thickness, which is smaller than the first thickness, in a second portion region of the curved portion different from the first portion region, and wherein the first portion region is disposed between the second portion region and the first attachment portion.

15. The method of claim 14, wherein the forming of the adhesive resin layer on the display panel comprises:
spraying an adhesive resin material onto the display panel using an inkjet method; and
curing the adhesive resin material sprayed onto the display panel to form the adhesive resin layer,
wherein the thickness of the second attachment portion in the first portion region is increased from the first thickness to the second thickness with increasing distance from the first attachment portion, and
the thickness of the second attachment portion in the second portion region is decreased from the second thickness to the third thickness with increasing distance from a border between the first portion region and the second portion region.

16. The method of claim 15, wherein, in the spraying of the adhesive resin material, a spray amount of the adhesive resin material sprayed through an inkjet head is controlled such that the adhesive resin material is sprayed on the first region of the display panel in a first spray amount and is sprayed on the second region of the display panel in a second spray amount, and
the first spray amount and the second spray amount are different,
wherein the display panel comprises a main display portion, which corresponds to the first region and is configured to display an image, and a sub-display portion, which corresponds to the second region and is configured to display an image.

17. The method of claim 15, wherein the spraying of the adhesive resin material comprises:
spraying a first adhesive resin material having a first modulus on the first region; and
spraying a second adhesive resin material having a second modulus greater than the first modulus on the second region,
wherein the adhesive resin layer further comprises a third attachment portion corresponding to the double-curved portion, and wherein the window further comprises a double-curved portion, which is extended from the front surface portion and is bent from the front surface portion with at least two curvatures.

18. The display device of claim 1, wherein:
the flat surface extends in a first direction and a second direction and forms a display surface of the window.

* * * * *